US012302544B2

(12) United States Patent
Choi

(10) Patent No.: US 12,302,544 B2
(45) Date of Patent: May 13, 2025

(54) CMOS SRAM CELL HAVING TRENCH STRUCTURE

(71) Applicant: Taihyun Choi, Incheon (KR)

(72) Inventor: Taihyun Choi, Incheon (KR)

( * ) Notice: Subject to any disclaimer, the term of this patent is extended or adjusted under 35 U.S.C. 154(b) by 0 days.

(21) Appl. No.: 18/837,881

(22) PCT Filed: Oct. 5, 2022

(86) PCT No.: PCT/KR2022/014942
§ 371 (c)(1),
(2) Date: Aug. 12, 2024

(87) PCT Pub. No.: WO2023/163308
PCT Pub. Date: Aug. 31, 2023

(65) Prior Publication Data
US 2025/0113477 A1     Apr. 3, 2025

(30) Foreign Application Priority Data
Feb. 22, 2022   (KR) .................. 10-2022-0023268

(51) Int. Cl.
*H10B 10/00*     (2023.01)
(52) U.S. Cl.
CPC ................... *H10B 10/12* (2023.02)
(58) Field of Classification Search
CPC ...................................................... H10B 10/12
See application file for complete search history.

(56) References Cited

U.S. PATENT DOCUMENTS

| 5,376,814 | A | 12/1994 | Lee |
| 9,093,304 | B2* | 7/2015 | Koldiaev ........... H01L 29/66795 |
| 11,659,703 | B2* | 5/2023 | Liaw .................... H10D 64/017 |
| | | | 257/351 |

FOREIGN PATENT DOCUMENTS

| KR | 10-1998-0059899 A | 10/1998 |
| KR | 10-0205315 B1 | 7/1999 |
| KR | 10-2004-0008453 A | 1/2004 |
| KR | 10-0530305 B1 | 11/2005 |
| KR | 10-1386132 B1 | 4/2014 |
| KR | 10-2018-0047698 A | 5/2018 |
| KR | 10-2021-0052292 A | 5/2021 |
| KR | 10-2440205 B1 | 9/2022 |

* cited by examiner

*Primary Examiner* — Allison Bernstein
(74) *Attorney, Agent, or Firm* — You & IP, LLC

(57) ABSTRACT

The present invention relates to a CMOS SRAM cell having a trench structure and, more specifically, to a CMOS SRAM cell having a trench structure, the CMOS SRAM cell being manufactured using a vertical MOSFET of a trench structure having a gate, a source, and a drain that form a vertical structure, such that there is a current flow in an active region between trench gate electrodes and vertical source and drain regions, and thus being capable of exhibiting various advantages with respect to density, operating frequency, noise margin, current handling capacity, power consumption, and manufacturing steps, compared to a conventional CMOS SRAM cell having a planar structure.

4 Claims, 5 Drawing Sheets

CMOS SRAM CELL HAVING TRENCH STRUCTURE

TECHNICAL FIELD

The present disclosure relates to a CMOS SRAM cell having a trench structure and, more specifically, to a CMOS SRAM cell having a trench structure, in which the CMOS SRAM cell is manufactured by using a vertical MOSFET of a trench structure having a gate, a source, and a drain that form a vertical structure so that a current flow occurs in an active region between trench gate electrodes and vertical source and drain regions, thereby having various advantages in density, operating frequency, noise margin, current handling capacity, power consumption, and manufacturing processes, etc. compared to a conventional CMOS SRAM cell having a planar structure.

BACKGROUND ART

A structure of an SRAM cell consists of two inverters and two pass gates and has a flip-flop structure having the output terminals of these inverters cross-coupled to each other.

In the SRAM cell, four transistors constituting two inverters are required to store information, and two transistors are required to select a specific cell from the outside.

Unlike a dynamic random access memory cell (a DRAM cell), such an SRAM cell is capable of retaining static data without a refresh operation due to the effect of flip-flop feedback as long as power is applied to the SRAM, and thus is called a static RAM.

The unit cell of SRAM may be largely classified into two types: one is a high load resistor SRAM cell that adopts a high resistance as a load device, and the other is a CMOS SRAM cell that adopts a PMOS transistor as a load device.

The CMOS SRAM cell may be classified into two types: one is a thin film transistor SRAM cell that adopts a thin film transistor (TFT) laminated on a semiconductor substrate as a load device, and the other is a bulk CMOS SRAM cell that adopts a bulk transistor formed on the semiconductor substrate as a load device.

The bulk SRAM cell has high cell stability compared to the thin film transistor SRAM cell and the high load resistor SRAM cell. In other words, the bulk CMOS SRAM cell has good low voltage characteristics and low stand-by current.

This is because, while the thin film transistor is generally manufactured by using a polysilicon film as a body layer, all the transistors constituting the bulk CMOS SRAM cell are formed on a single crystal silicon substrate.

However, the bulk CMOS SRAM cell has low integration density compared to the thin film transistor SRAM cell.

Although the thin film transistor SRAM cell has higher integration density than the bulk CMOS SRAM cell, the integration density of the thin film transistor SRAM cell is lower than the integration density of the DRAM cell.

Therefore, in order to implement a highly-density SRAM device with high reliability, it is required to design a compact cell with a three-dimensional structure.

Korean Patent No. 10-0530305 discloses an SRAM cell structure using a vertical MOSFET, and this conventional SRAM cell structure enables the formation of multi-gate FETs but has a disadvantage in that the SRAM cell structure has a limit to improving integration density because the pull-down transistors or pull-up transistors that constitute the SRAM cell are merely arranged respectively by using the multi-gate FETs.

DISCLOSURE

Technical Problem

The present disclosure has been made to solve the above problems occurring in the prior art, and is intended to propose a CMOS SRAM cell having a trench structure, in which the CMOS SRAM cell is manufactured by using a vertical MOSFET of a trench structure having a gate, a source, and a drain that form a vertical structure so that a current flow occurs in an active region between trench gate electrodes and vertical source and drain regions, thereby having various advantages in density, operating frequency, noise margin, current handling capacity, power consumption, and manufacturing processes, etc. compared to a conventional CMOS SRAM cell having a planar structure.

Technical Solution

In order to accomplish the above objectives, the present disclosure provides a CMOS SRAM cell including: a semiconductor substrate of first polarity having one polarity, multiple diffusion regions being formed to be spaced apart from each other as vertical structures having predetermined cross-sections and predetermined depths from a surface of the semiconductor substrate, with the multiple diffusion regions having second polarity opposite to the polarity of the semiconductor substrate and the same first polarity as the polarity of the semiconductor substrate, multiple electrodes formed on upper parts of the diffusion regions, with each of the multiple electrodes configured to operate as a source electrode, a drain electrode, or a substrate electrode of a MOSFET by applying each signal voltage, multiple trenches formed to be spaced apart from each other by having predetermined cross-sections and predetermined depths from the surface of the semiconductor substrate, an insulating layer formed on a surface of each of the trenches from the surface of the semiconductor substrate, a conductive material filled in the trench inside the insulating layer, and a MOSFET formed on an upper part of the trench filled with the conductive material and having a gate electrode of the MOSFET to which each signal voltage is applied.

In addition, in the present disclosure, to form a complementary MOSFET that is complementary to the MOSFET having one polarity, the CMOS SRAM cell may include: a well region of second polarity formed in the semiconductor substrate of first polarity, multiple diffusion regions being formed to be spaced apart from each other as vertical structures having predetermined cross-sections and predetermined depths from a surface of the well region, with the multiple diffusion regions having the first polarity opposite to the polarity of the well region and the same second polarity as the polarity of the well region, multiple electrodes formed on upper parts of the diffusion regions, with each of the multiple electrodes configured to operate as a source electrode, a drain electrode, or a well region electrode of the complementary MOSFET by applying each signal voltage, multiple trenches formed to be spaced apart from each other by having predetermined cross-sections and predetermined depths from the surface of the well region, an insulating layer formed on a surface of each of the trenches from the surface of the well region, a conductive material filled in the trench inside the insulating layer, and a MOSFET formed on an upper part of the trench filled with the conductive material and having a gate electrode of the complementary MOSFET to which each signal voltage is applied.

In this case, the multiple diffusion regions or trench gate electrodes of the MOSFET having the first or second polarity may be connected to each other by the conductive material.

Advantageous Effects

According to the present disclosure, by allowing the flow of a current to occur in a vertical channel formed by trench gate electrodes and vertical source and drain, the vertical volume of silicon is utilized, and accordingly, it is possible to increase a current handling capacity without consuming a surface area and to improve speed and integration density.

In addition, according to the present disclosure, through a trench structure, multiple gate electrodes can be used, and the vertical size and spacing of the gate electrodes and vertical source and drain diffusion regions are controlled, and accordingly, it is possible to significantly increase a current and charge handling capacity and to manufacture a smaller, higher-density, higher-speed SRAM cell accordingly.

In addition, according to the present disclosure, compared to a conventional planar-structured SRAM cell, it is easy to process signals, and by avoiding short channel effects, a leakage current can be reduced, and accordingly, it is possible to reduce stand-by power dissipation and to improve operating frequency due to improved noise margin.

BEST MODE

Hereinafter, exemplary embodiments of a CMOS SRAM cell having a trench structure according to the present disclosure will be described in detail with reference to the accompanying drawings.

Figure 1:
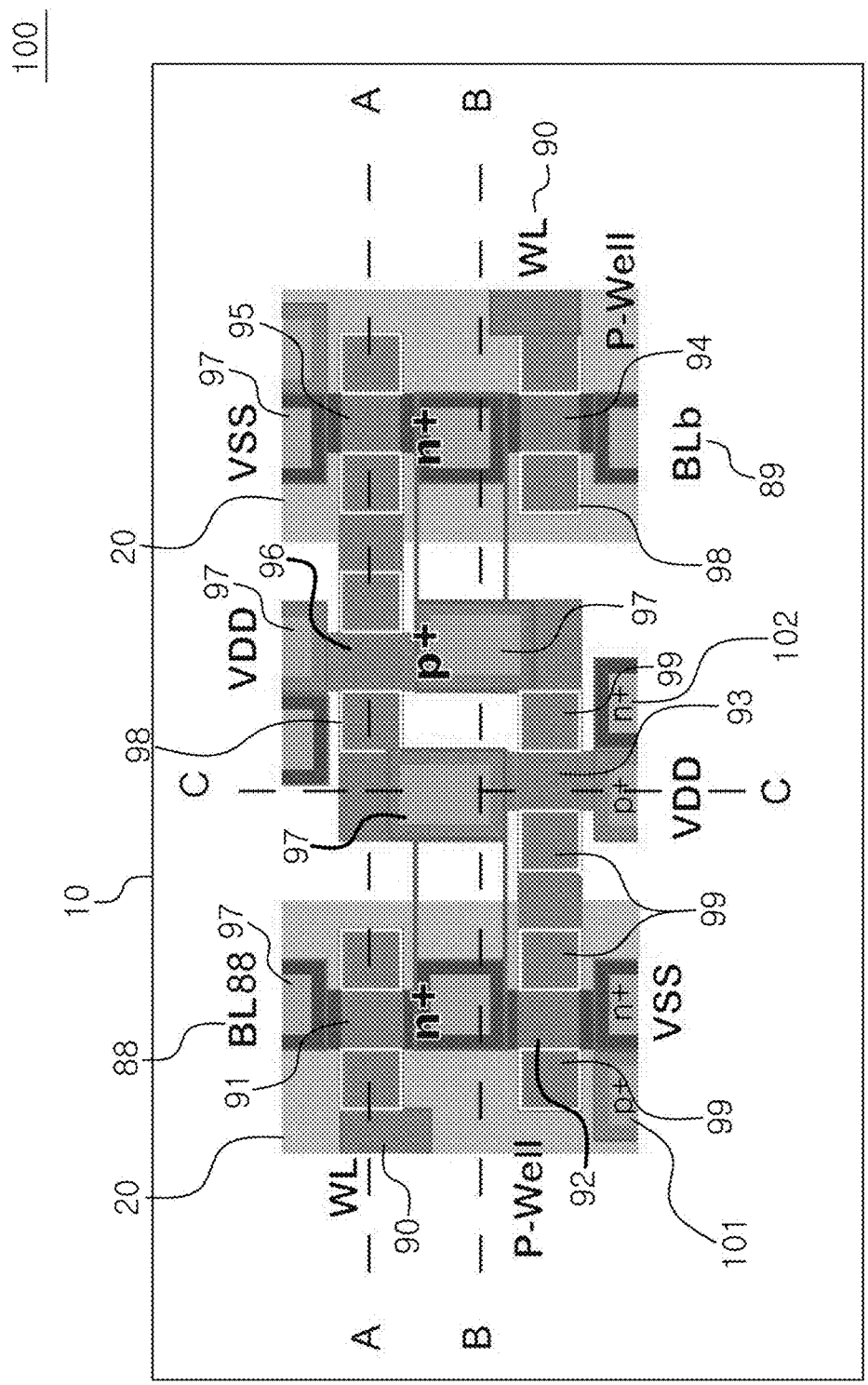
FIG. 1 is a plan view illustrating a CMOS SRAM cell having a trench structure according to the present disclosure.
Figure 2:
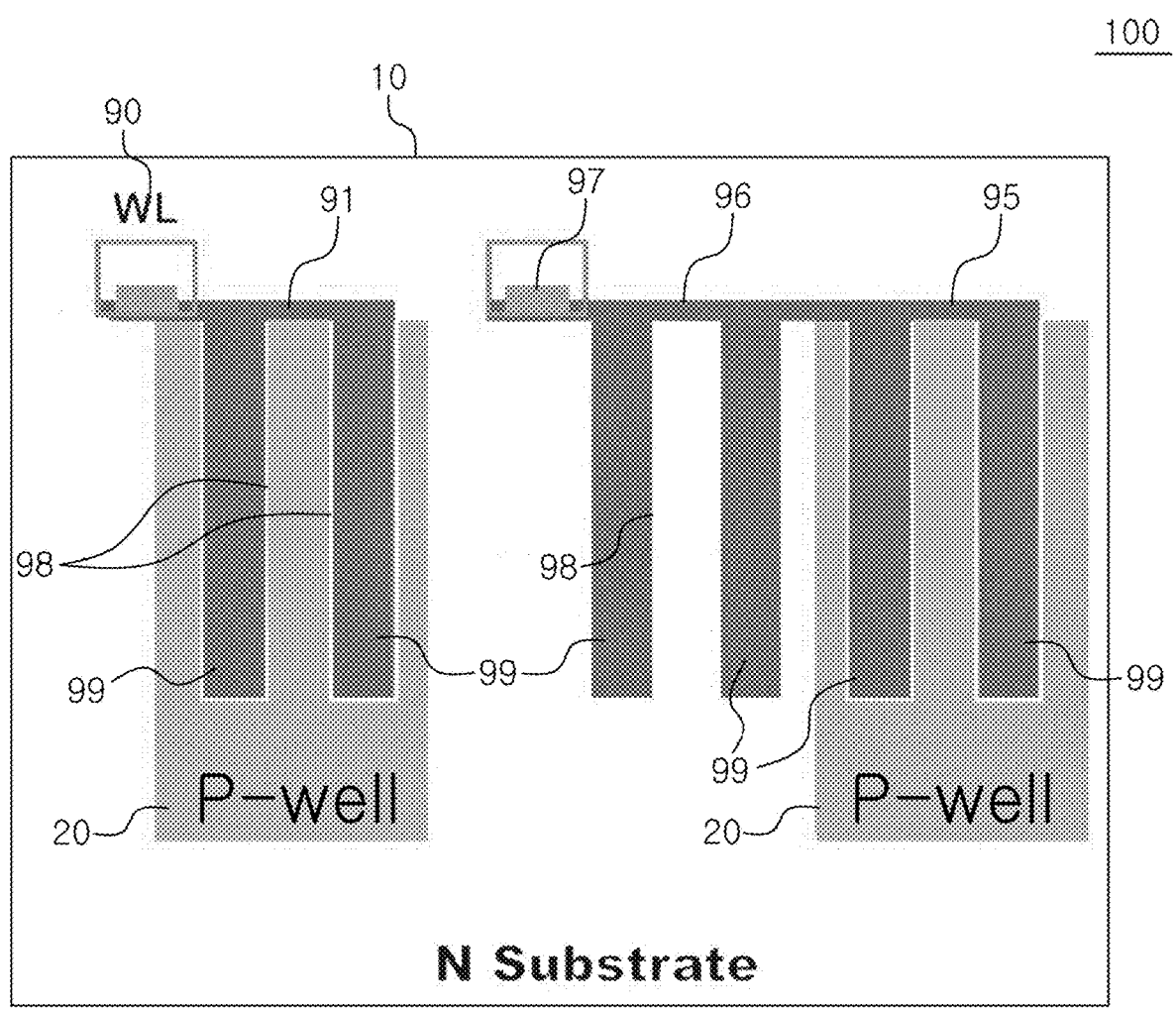
FIG. 2 is a cross-sectional view taken along line A-A of the CMOS SRAM cell of the present disclosure illustrated in FIG. 1.
Figure 3:
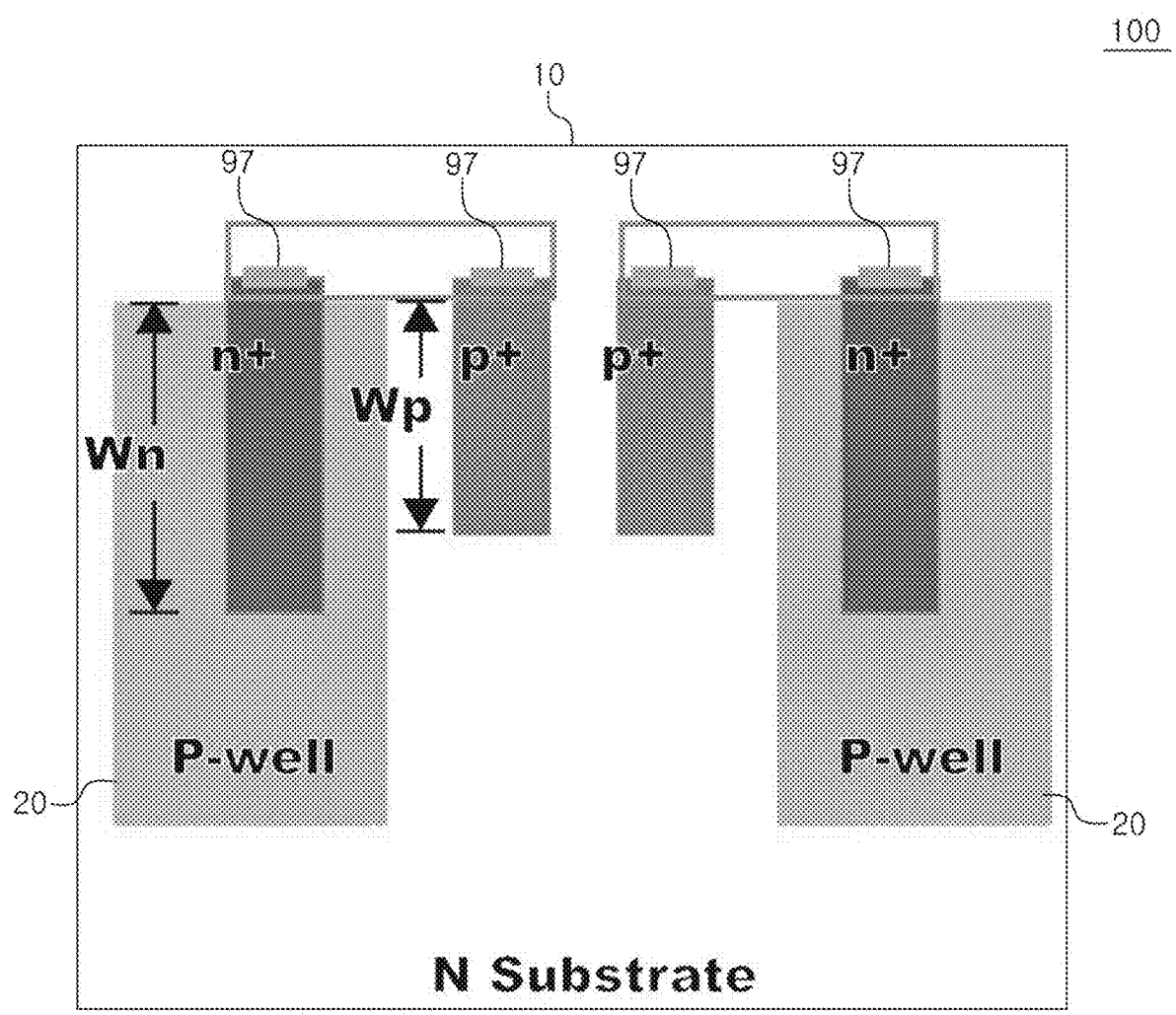
FIG. 3 is a cross-sectional view taken along line B-B of the CMOS SRAM cell of the present disclosure illustrated in FIG. 1.
Figure 4:
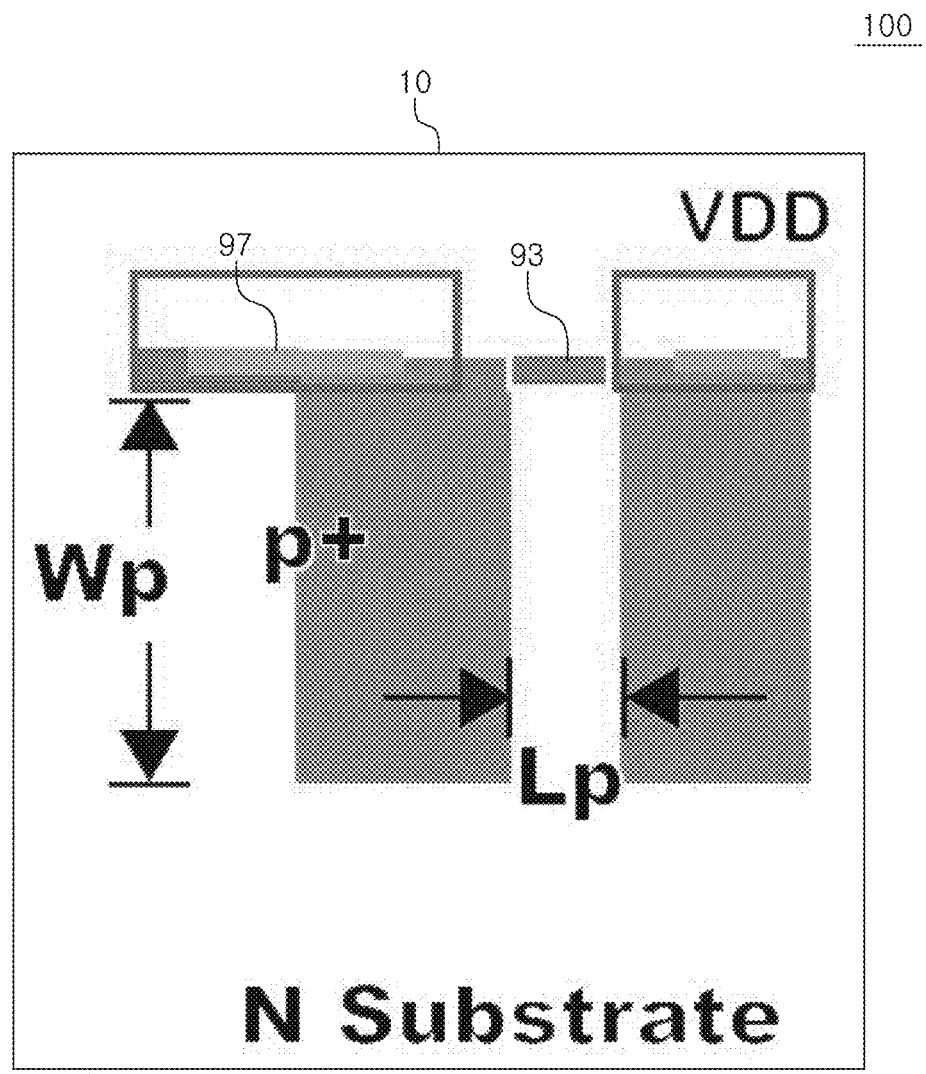
FIG. 4 is a cross-sectional view taken along line C-C of the CMOS SRAM cell of the present disclosure illustrated in FIG. 1.
Figure 5:
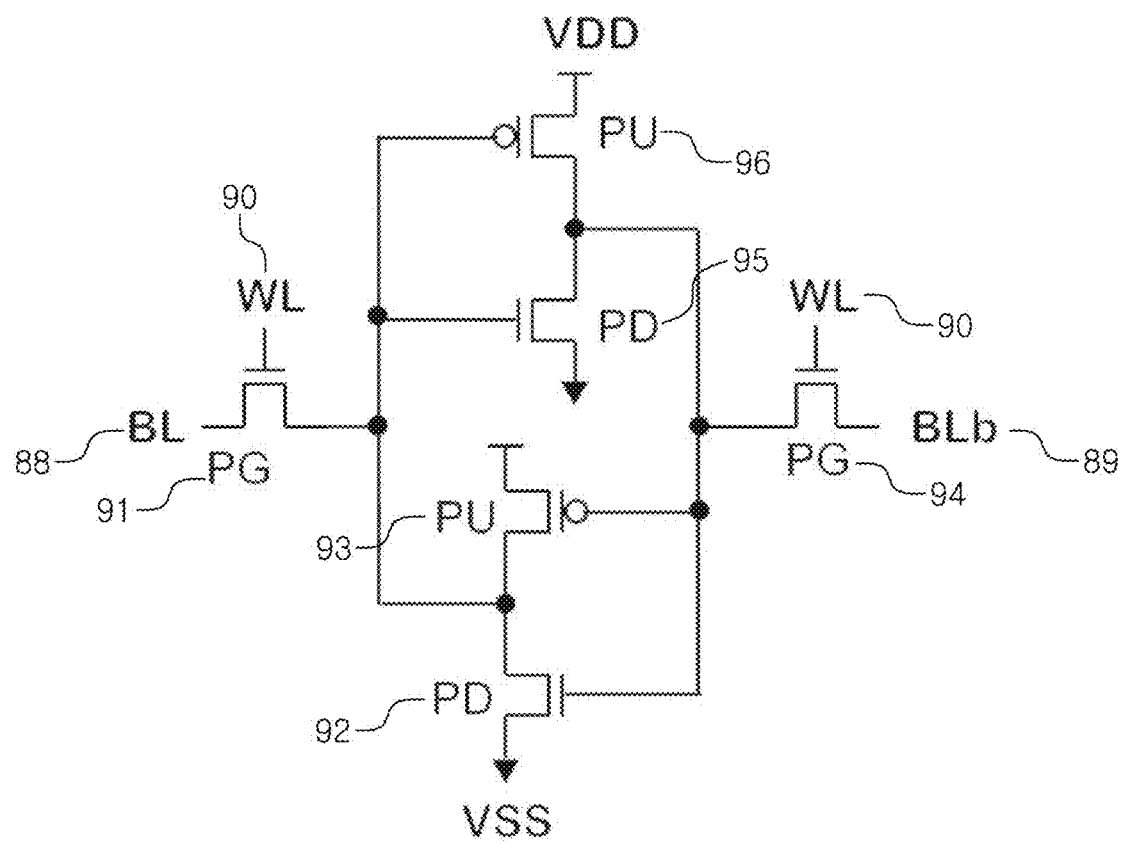
FIG. 5 is a circuit diagram of the CMOS SRAM cell having a trench structure according to the present disclosure.

FIG. 1 is a plan view illustrating a CMOS SRAM cell having a trench structure according to the present disclosure, FIG. 2 is a cross-sectional view taken along line A-A of the CMOS SRAM cell of the present disclosure illustrated in FIG. 1, FIG. 3 is a cross-sectional view taken along line B-B of the CMOS SRAM cell of the present disclosure illustrated in FIG. 1, FIG. 4 is a cross-sectional view taken along line C-C of the CMOS SRAM cell of the present disclosure illustrated in FIG. 1, and FIG. 5 is a circuit diagram of the CMOS SRAM cell having a trench structure according to the present disclosure.

The present disclosure relates to a CMOS SRAM cell 100 (hereinafter, referred to as 'an SRAM cell 100') having a trench structure, in which the CMOS SRAM cell is manufactured by using a vertical MOSFET of a trench structure having a gate, a source, and a drain that form a vertical structure so that a current flow occurs in an active region between trench gate electrodes 99 and vertical source and drain regions, thereby having various advantages in density, operating frequency, noise margin, current handling capacity, power consumption, and manufacturing processes, etc. compared to a conventional CMOS SRAM cell having a planar structure. As illustrated in FIG. 1, the CMOS SRAM cell 100 is configured as a 6-transistor SRAM cell 100 including a semiconductor substrate 10 having either an N-type or P-type polarity (hereinafter referred to as "first polarity"), a well region 20 formed in the semiconductor substrate 10 and having a different polarity (hereinafter referred to as 'second polarity') from a polarity of the semiconductor substrate 10, and a vertical MOSFET of a trench structure including multiple trench gates 99, sources, and drains.

That is, the SRAM cell 100 according to the present disclosure may include the semiconductor substrate 10 of first polarity, and multiple diffusion regions and trench electrodes 99 formed in the semiconductor substrate 10, wherein each of the diffusion regions may be formed as a vertical structure having a predetermined cross-section and a predetermined depth from the surface of the semiconductor substrate 10. Hereinafter, a case in which the first polarity is N-type, that is, an N-type semiconductor substrate 10 will be mainly described.

In this case, the diffusion regions may be formed to have the second polarity opposite to the polarity of the N-type semiconductor substrate 10, i.e., P-type, or the same first polarity, i.e., N-type, and be spaced apart from each other by a predetermined distance, and may be doped to be relatively high with an impurity of concentration of $10^{17}$ to $10^{20}$ cm$^{-3}$.

Multiple trenches 99 having predetermined cross-sections and predetermined depths are formed to be spaced apart from each other by a predetermined distance in the semiconductor substrate 10 of the first polarity, i.e., the N-type semiconductor substrate 10, and the well region 20 of the second polarity, i.e., the P-type well region 20, the diffusion regions of the first or second polarity are formed in the semiconductor substrate 10 and the well region 20, and multiple electrodes are formed on the upper parts of the diffusion regions to apply each signal voltage to the source electrode or drain electrode of the MOSFET.

An insulating layer 98 such as an oxide film having a thin thickness of about 1 μm or less may be formed on the inner surface of each trench 99 formed in the semiconductor substrate 10, the trench 99 inside the insulating layer 98 is filled with a conductive material such as polysilicon, and multiple electrodes are formed on an upper portion thereof to operate as gate electrodes of the MOSFET and apply each signal voltage.

In addition, the P-type well region 20, which is intended to create the MOSFET and a complementary MOSFET formed in the semiconductor substrate 10, is formed to have second polarity, and source and drain diffusion regions having first polarity are formed in the P-type well region 20 having the second polarity, so it is possible to form a MOSFET having polarity opposite to the MOSFET formed in the semiconductor substrate 10.

In this case, as illustrated in FIG. 1, in the N-type semiconductor substrate 10, first polarity, i.e., an N-type diffusion region 102 for applying a predetermined voltage is formed, and in the P-type well region 20, second polarity, i.e., a P-type diffusion region 101 for similarly applying a predetermined voltage is formed.

In more detail, the SRAM cell 100 includes two N-type pass-gate transistors 91 and 94, two back-to-back CMOS inverters, and a contact region 97 connecting a diffusion region and a poly-silicon region with a conductive material such as a metal.

In addition, as illustrated in FIG. 5, a bit line 88 and an inverted bit line 89 that serve as a passage for data to be transferred between the outside and the SRAM cell 100 and supply a voltage to a drain terminal, and a word line 90 that serves as a switch between the bit line 88 and the SRAM cell 100 and supplies a voltage to a gate terminal are provided. Accordingly, the bit line 88 and the inverted bit line 89 are connected to the inverters in the SRAM cell 100 through the pass-gate transistors 91 and 94 by the word line 90.

In addition, the output of a left inverter, i.e., a first side inverter, which includes an N-type pull-down transistor 92 and a P-type pull-up transistor 93, is connected to the input of a right inverter, i.e., a second side inverter, which includes an N-type pull-down transistor 95 and a P-type pull-up transistor 96.

To be more specific, as illustrated in FIG. 2, in the P-type well region 20 of the second polarity formed in the semiconductor substrate 10, the N-type pass-gate transistor 91 and the N-type pull-down transistor 95 are formed as the structure of the trench gate 99, and in the semiconductor substrate 10 of first polarity, the P-type pull-up transistor 96 may be formed as the structure of the trench gate 99.

In this case, as illustrated in FIGS. 3 and 4, the width W of each of the transistors 91, 95, and 96 is proportional to the depths Wn and Wp of the n+ and p+ diffusion regions.

In addition, as illustrated in FIGS. 1, 3, and 4, in the N-type semiconductor substrate 10, an n+ diffusion region of first polarity or a p+ diffusion region of second polarity is formed, and likewise, even in the P-type well region 20, an n+ diffusion region of first polarity or a p+ diffusion region of second polarity is formed.

The contact region 97 for connection with a conductive material is formed on each of the upper portions of the diffusion region and polysilicon.

In addition, as illustrated in FIG. 4, p+ diffusion regions having depths of Wp are formed in the N-type semiconductor substrate 10, and the P-type pull-up transistor 93 having the channel length of Lp is formed in the structure of the trench gate 99 between the p+ diffusion regions.

That is, the SRAM cell 100 according to the present disclosure may realize the structure of the SRAM cell 100 having a much larger channel width W to channel length L ratio than an existing planar structure SRAM cell by replacing the planar polysilicon gate of the existing planar structure SRAM cell with the trench structure gate 99.

In addition, as can be seen in FIGS. 3 and 4, the channel widths W and channel lengths L of an N-channel MOSFET and a P-channel MOSFET are defined by depth of source and drain diffusion regions and a distance between the source and drain diffusion regions, respectively, and for gate electrodes with the same trench depths, the channel widths of P-type and N-type transistors are determined by Wp and Wn, which are the depths of the p+ and n+ diffusion regions.

The channel widths W of the six transistors 91, 92, 93, 94, 95, and 96 may be optimized by controlling the gate electrodes 99 and the depths Wp and Wn of the diffusion regions, thereby enabling the implementation of high-frequency and high-performance devices.

As can be seen in FIG. 1, all the transistors 91, 92, 93, 94, 95, and 96 have gate electrodes 99 of minimum size, and accordingly, it is possible to minimize the entire surface area of the SRAM cell 100, and more easily manufacture the trench gate electrodes 99 and the diffusion regions with a large surface area to depth (an aspect ratio).

In addition, the channel width W of the P-type pull-up transistor 93 is the sum of twice the depth Wp of the diffusion region and the spacing Lp of the gate electrodes, which is the same as the structure of a tri-gate bulk FinFET.

As described above, the six transistors 91, 92, 93, 94, 95, and 96 having an increased channel width W to channel length L ratio, i.e., a surface area to depth (an aspect ratio), may have reduced stand-by power dissipation as well as increased noise margin and increased operating frequency.

That is, by effectively controlling short channel effects in a channel formed between two gate electrodes, a leakage current in the channel may be reduced, thereby reducing stand-by power dissipation.

In addition, due to the transistors 91, 92, 93, 94, 95, and 96 with minimal gate electrodes and an increased aspect ratio, it is possible to manufacture a small-sized SRAM cell 100 of a high-performance without significantly increasing masking steps, and the channel including a pair of trench gate electrodes has a larger alignment tolerance compared to conventional planar structure cells. Furthermore, a channel, which includes a pair of trench gate electrodes, has greater alignment tolerance compared to a conventional planar structure cell.

The above-described embodiments describe the most preferred examples of the present disclosure, but the examples are not limited to the above-described embodiments. The SRAM cell 100 according to the present disclosure may be applied to an application processor, a CPU, and a graphics processing unit (GPU) that require high density, high frequency operation, and low power consumption, or the trench structure of the present disclosure may be applied as a replacement for various existing planar structure devices such as CMOS digital and analog devices, an image sensor, a signal processing device, a memory device, and a power device, and various modifications are possible within a scope that does not deviate from the technical idea of the present disclosure.

INDUSTRIAL APPLICABILITY

The present disclosure relates to a CMOS SRAM cell having a trench structure and, more specifically, to a CMOS SRAM cell having a trench structure, in which the CMOS SRAM cell is manufactured by using a vertical MOSFET of a trench structure having a gate, a source, and a drain that form a vertical structure so that a current flow occurs in an active region between trench gate electrodes and vertical source and drain regions, thereby having various advantages in density, operating frequency, noise margin, current handling capacity, power consumption, and manufacturing processes, etc. compared to a conventional CMOS SRAM cell having a planar structure.

The invention claimed is:

1. A CMOS SRAM cell having a trench structure, the CMOS SRAM cell comprising:
   a semiconductor substrate of first polarity having one polarity,
   multiple diffusion regions being formed to be spaced apart from each other as vertical structures having predetermined cross-sections and predetermined depths from a surface of the semiconductor substrate, with the multiple diffusion regions having second polarity opposite to the polarity of the semiconductor substrate and the same first polarity as the polarity of the semiconductor substrate,
   multiple electrodes formed on upper parts of the diffusion regions, with each of the multiple electrodes configured to operate as a source electrode, a drain electrode, or a substrate electrode of a MOSFET by applying each signal voltage, multiple trenches formed to be spaced apart from each other by having predetermined cross-sections and predetermined depths from the surface of the semiconductor substrate, an insulating layer formed on a surface of each of the trenches from the surface of the semiconductor substrate, a conductive material filled in the trench inside the insulating layer, and a MOSFET formed on an upper part of the trench filled with the conductive material and having a gate electrode of the MOSFET to which each signal voltage is applied.

2. The CMOS SRAM cell of claim 1, wherein to form a complementary MOSFET that is complementary to the MOSFET having one polarity, the CMOS SRAM cell comprises:

a well region of second polarity formed in the semiconductor substrate of first polarity, multiple diffusion regions being formed to be spaced apart from each other as vertical structures having predetermined cross-sections and predetermined depths from a surface of the well region, with the multiple diffusion regions having the first polarity opposite to the polarity of the well region and the same second polarity as the polarity of the well region, multiple electrodes formed on upper parts of the diffusion regions, with each of the multiple electrodes configured to operate as a source electrode, a drain electrode, or a well region electrode of the complementary MOSFET by applying each signal voltage, multiple trenches formed to be spaced apart from each other by having predetermined cross-sections and predetermined depths from the surface of the well region, an insulating layer formed on a surface of each of the trenches from the surface of the well region, a conductive material filled in the trench inside the insulating layer, and a MOSFET formed on an upper part of the trench filled with the conductive material and having a gate electrode of the complementary MOSFET to which each signal voltage is applied.

3. The CMOS SRAM cell of claim 1, wherein the multiple diffusion regions or trench gate electrodes of the MOSFET having the first or second polarity are connected to each other by the conductive material.

4. The CMOS SRAM cell of claim 2, wherein the multiple diffusion regions or trench gate electrodes of the MOSFET having the first or second polarity are connected to each other by the conductive material.

* * * * *